United States Patent
Ohshima et al.

(10) Patent No.: US 6,486,001 B1
(45) Date of Patent: Nov. 26, 2002

(54) FABRICATING METHOD OF SEMICONDUCTOR DEVICE

(75) Inventors: Yumiko Ohshima, Yokohama (JP); Naoko Yamaguchi, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/522,169

(22) Filed: Mar. 9, 2000

(30) Foreign Application Priority Data

Mar. 10, 1999 (JP) .......................................... P11-063367

(51) Int. Cl.⁷ .......................... H01L 21/44; H01L 21/48; H01L 21/50; H01L 23/48
(52) U.S. Cl. ...................... 438/108; 438/118; 438/119; 438/613; 257/779
(58) Field of Search ................................ 438/108, 119, 438/118, 613; 257/738, 778, 789, 779

(56) References Cited

U.S. PATENT DOCUMENTS 5,844,320 A   12/1998  Ono et al.
6,103,551 A  * 8/2000  Ono et al. .................. 438/108

FOREIGN PATENT DOCUMENTS

| JP | 08031871 | * | 2/1996 |
| JP | 07269132 | * | 4/1997 |
| JP | 11154550 | * | 6/1999 |
| JP | 10245685 | * | 3/2000 |

* cited by examiner

Primary Examiner—Olik Chaudhuri
Assistant Examiner—Shrinivas H. Rao
(74) Attorney, Agent, or Firm—Finnegan, Henderson, Farabow, Garrett & Dunner, L.L.P.

(57) ABSTRACT

According to a fabricating method of the present invention, a cap shaped cover plate having a concaved portion on the inner surface is mounted on the rear surface of a semiconductor chip. After solder bumps are formed on a connecting pad of a wiring substrate, a fluid resin layer is formed on the bump formed surface. Thereafter, the semiconductor chip with the cover plate adhered is mounted with a face down on the resin layer formed surface of the wiring substrate. The solder bumps on the chip side and the solder bumps on the substrate side are contacted. At that time, the peripheral portion of the cover plate is contacted and adhered to the wiring substrate. Thereafter, while the bumps on the chip side and the bumps on the substrate side are being heated, melted, and connected, the fluid resin layer on the wiring substrate is hardened. Thus, the space between the semiconductor chip and the wiring substrate (namely, the height of the bumps) is controlled to a predetermined value. As a result, a semiconductor device having a flip-chip bonded portion with high reliability can be fabricated with simplified steps and high yield.

15 Claims, 7 Drawing Sheets

FABRICATING METHOD OF SEMICONDUCTOR DEVICE

BACKGROUND OF THE INVENTION

1. Field of the Invention

The present invention relates to a fabricating method of a semiconductor device for use with various electronic units.

2. Description of the Related Art

According to the demand of a smaller and thinner semiconductor device, a semiconductor element (chip) has been connected by use of flip-chip bonding. In the flip-chip bonding method, a semiconductor chip is mounted with a face down (with an electrode pad formed surface downward) on a wiring substrate. Protruded electrode composed of for example solder (hereinafter referred to as bumps) formed on an electrode pad of the semiconductor chip is pressed to a connecting pad of the wiring substrate and then heated. Thus, the solder is reflowed and thereby the electrode pad is connected to the connecting pad of the wiring substrate. Alternatively, solder bump may be formed on a connecting pad of a wiring substrate. The flip-chip bonding method is superior to the wire bonding method in the mount density.

In a flip-chip bonded semiconductor device, the thermal expansion coefficient of a semiconductor chip composed of silicon or the like is largely different from that of a wiring substrate (for example, a glass cloth-epoxy resin impregnated wiring substrate). The stress due to the difference of the thermal expansion coefficients between the semiconductor chip and the wiring substrate is applied to solder bumps that connect the semiconductor chip and the wiring substrate, the connected portion being deteriorated.

Figure 8:
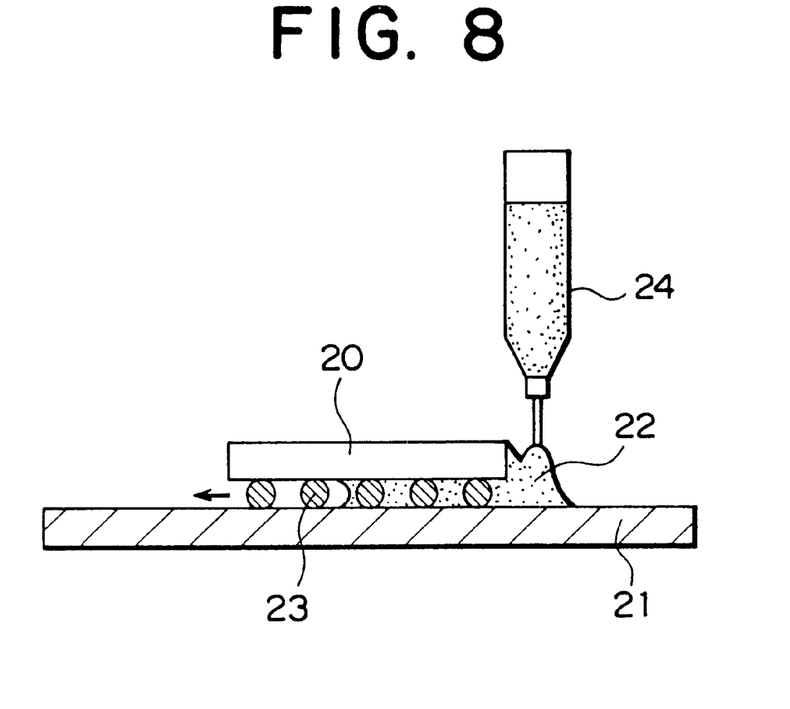
FIG. 8 is a cross section showing a forming method of a resin encapsulation layer according to an existing fabricating method of a semiconductor device.

To prevent such a problem, after solder is reflowed, as shown in FIG. 8, liquid resin 22 such as epoxy resin is filled in a space (gap portion) between a semiconductor chip 20 an a wiring substrate 21 due to capillary phenomenon. Thus, a resin encapsulation layer (referred to as underfill) is formed. The resin encapsulation layer alleviates the thermal stress due to the difference of the thermal expansion coefficients between the wiring substrate and the semiconductor chip. In addition, the resin encapsulation layer reinforces and mechanically protects the flip-chip bonded portion. In FIG. 8, reference numeral 23 denotes solder bumps. Reference numeral 24 denotes a dispenser that dispenses drops of liquid resin.

However, in such a method of forming a resin encapsulation layer, it takes a long time to fill liquid resin. In addition, the dispersibility of a filler contained in the liquid resin deteriorates on the flow end side thereof. Thus, a flow mark will take place.

To fabricate a flip-chip bonded semiconductor device, a simultaneous connecting method is known. In the simultaneous connecting method, while-bumps are being heated and connected (solder is reflowed), the resin encapsulation layer is formed.

Figure 9:
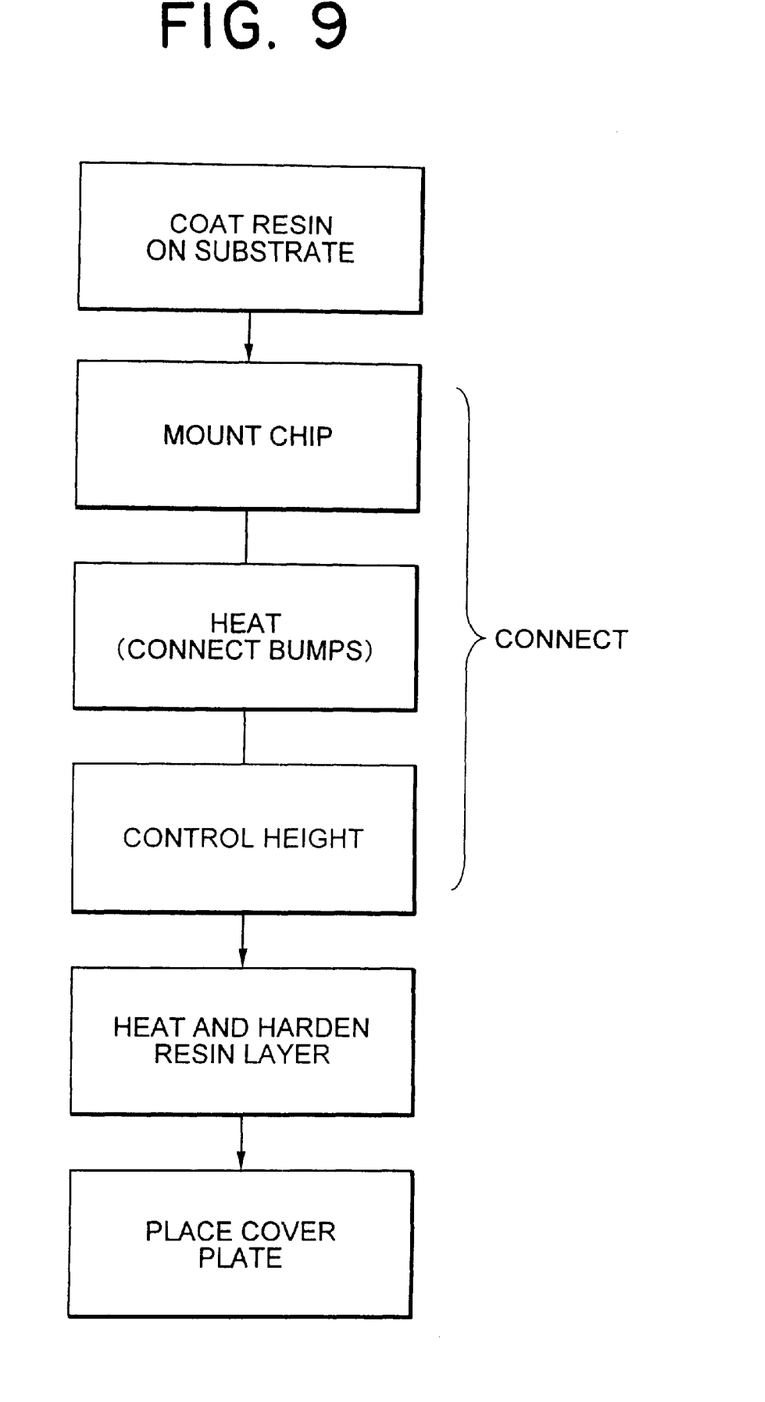
FIG. 9 is a flow chart showing a fabricating method of a semiconductor device according to an existing simultaneous connecting method.
Figure 10A:
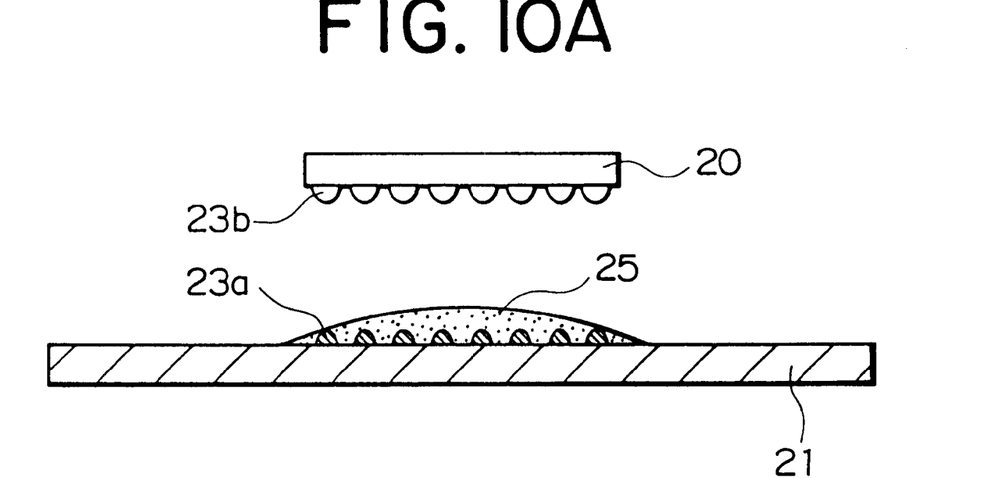
FIG. 10A, FIG. 10B and FIG. 10C are schematic diagrams showing individual steps of an existing fabricating method of a semiconductor device.
Figure 10B:
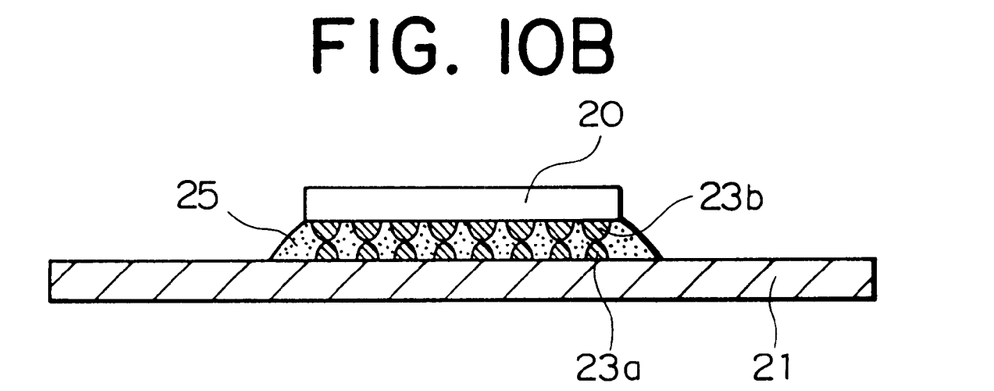

In the method, as shown in FIGS. 9 and 10, after fluid resin 25 that contains flux or a reductive material is coated on a wiring substrate 21 (FIG. 10A), at a flip-chip bonding step, the semiconductor chip 20 is mounted. Bumps 23 are heated and melted (reflowed). In addition, the height of the bumps 23 is controlled (FIG. 10B). Thereafter, the fluid resin 25 layer is heated and hardened. The height of the bumps 23 is controlled so as to keep the space between the semiconductor chip 20 and the wiring substrate 21 with a predetermined size.

Figure 10C:
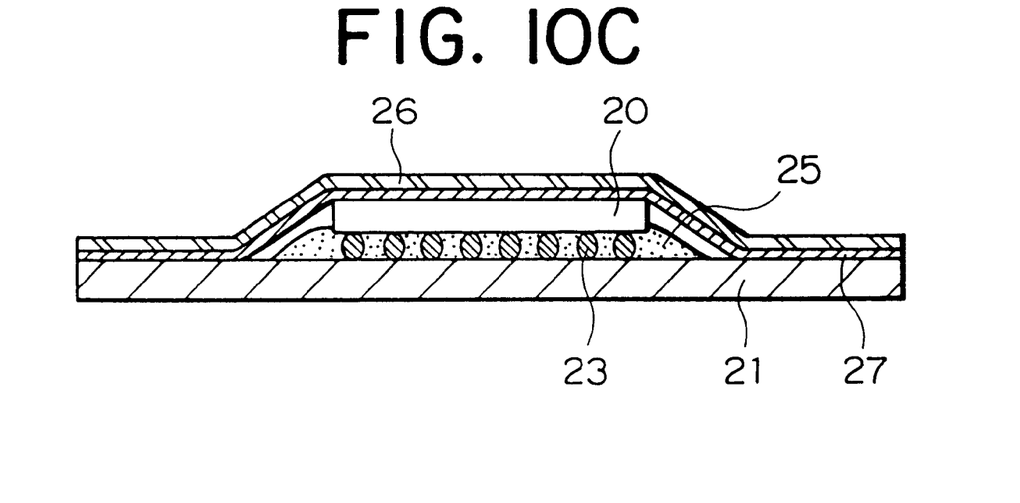

Thereafter, when necessary, as shown in FIG. 10C, a cover plate 26 is placed on the upper surface (the opposite surface of the electrode pad formed surface) of the semiconductor chip 20. The cover plate 26 is adhered to the semiconductor chip 20 with adhesive agent 27.

However, in the simultaneous connecting method, since the fluid resin 25 is coated on the connecting pad of the wiring substrate 21, the fluid resin 25 resides at the connection interface of the bumps 23. Thus, a connection defect tends to take place. To prevent the connection defect due to adhesion and residue of such resin, an extra step is required along with the flip-chip bonding step. However, it is difficult to adjust each step. Thus, the steps become complicated.

In other words, when the semiconductor chip 20 is mounted, to force aside the fluid resin 25 coated on the bump 23a on the substrate side with the bump 23b on the chip side, the semiconductor chip 20 should be pressed downward. In addition, to prevent the fluid resin 25 from entering the contacted surface of the bumps 23a and 23b, while the semiconductor chip 20 is being pressed, the solder should be heated and melted.

As described above, to alleviate the stress due to the difference of the thermal expansion coefficients between the semiconductor chip 20 and the wiring substrate 21, it is necessary to keep the bumps 23 disposed therebetween with a predetermined height. Thus, while solder is being reflowed, the height of the bumps 23 should be controlled. Consequently, it is difficult to adjust such steps.

In addition, when there are many bumps 23, it is difficult to completely force aside the resin 25 at the connection interface of the bumps 23a on the substrate side and the bumps 23b on the chip side. Thus, a connection defect tends to take place due to the adhesion or residual of the resin 25 at the bumps connection interface.

Thus, in the simultaneous connecting method of which the flip-chip bonding step and resin filling step are simultaneously performed, it is difficult to accomplish a semiconductor device with high connection reliability that satisfies the requirements of small size and many pins.

In addition, when solder bumps are melted, they become round and thereby the connection height becomes lower. Thus, it is difficult to maintain the reliability of the semiconductor device. Further, since the bumps become round, it is difficult to decrease the pitch of the bumps.

The inventors of the present invention know that a fabricating method of a semiconductor device that prevents resin from adhering and residing between an electrode pad and bumps. In the method, a fluid thermosetting adhesive layer is formed on an electrode pad formed surface of a semiconductor chip or on a connecting pad of a wiring substrate. And the adhesive layer is forced aside by bumps.

However, in such a method, when the number of bumps becomes large, it is difficult to completely force aside the adhesive layer that resides at the bump interface with the bumps. Thus, since the adhesive agent layer resides at the bump interface, electric connections become insufficient. In other words, it is difficult to satisfy the requirements of smaller size and more pins of a semiconductor chip.

SUMMARY OF THE INVENTION

The present invention is made from the above-described point of view. An object of the present invention is to provide a method of fabricating a semiconductor device with high connection reliability of a flip-chip bonded portion with simplified steps and high yield.

A first aspect of the present invention is a fabricating method of a semiconductor device, comprising the steps of (a) forming a resin layer on a connecting terminal formed surface of a wiring substrate, the wiring substrate having a connecting terminal and a wiring layer on at least one main surface thereof, (b) adhering an inner surface of a cover member on the opposite surface of an electrode terminal formed surface of a semiconductor element, the semiconductor element having an electrode terminal on a main surface thereof, (c) mounting the semiconductor element with the cover member placed with a face down on a surface of which the resin layer of the wiring substrate is formed, contacting a peripheral portion of the inner surface of the cover member, and contacting the electrode terminal of the semiconductor element and the connecting terminal of the wiring substrate through bumps formed on at least one of the electrode terminal and the connecting terminal, and (d) heating and melting the bumps to connect the electrode terminal of the semiconductor element and the connecting terminal of the wiring substrate therewith.

As the bumps, bumps composed of low-melting metals such as solders can be used. In particular, it is preferable to use Pb—Sn solder bumps, Sn—Ag solder bumps, or Sn—Ag—Cu solder bumps.

In the fabricating method of a semiconductor device according to the first aspect, at the bump connecting step, while bumps are being heated, melted, and connected, the resin layer formed on the wiring substrate can be cross-linked and hardened. When the bumps are connected and the resin layer is hardened at the same step, the number of steps can be reduced.

As an example of the cover member, a cap type cover member having a concaved portion in a semiconductor element attached portion can be used. The depth of the concaved portion is set to equal to or smaller than the sum of the height of the bumps being connected (hereinafter simply referred to as the height of bumps) and the thickness of the semiconductor element. The inner surface of the concaved portion is adhered with the opposite surface of the electrode terminal formed surface of the semiconductor element.

In such a structure, in the state that the semiconductor element is mounted on the wiring substrate, since the peripheral portion of the inner surface of the cover member directly contacts the wiring substrate, the bumps connection interface is stably pressed. Since the size of the space (gap portion) between the semiconductor element and the wiring substrate (namely, the height of the bumps) is controlled, it is not necessary to use an extra height controlling means.

As an example of the cover member, a plate member that does not have a concaved portion can be used. In this case, an adhesive layer with the thickness that is equal to or smaller than the sum of the height of the bumps and the thickness of the semiconductor element is formed at the peripheral portion of the inner surface of the cover member. At the semiconductor element mounting step, it is preferable to contact and adhere the adhesive layer and the wiring substrate.

Instead of disposing the adhesive layer on the cover member, a resin layer with the thickness that is equal to or smaller than the sum of the height of the bumps and the thickness of the semiconductor element may be formed in a peripheral area of a semiconductor element mounted portion of the wiring substrate. In the semiconductor element mounting step, the cover member may be contacted to the wiring substrate through the resin layer. As an example of the resin, resist such as solder resist is used. In such a method, the resin layer functions as a dam for an underfill resin layer formed on the connecting terminal formed surface of the wiring substrate. Thus, the resin layer is prevented from excessively spreading out. Consequently, an underfill having a fillet-shaped portion is formed.

According to the first aspect of the present invention, at the step of which a semiconductor element with a cover member is mounted to a wiring substrate, a peripheral portion of a inner surface of a cover member is contacted to the wiring substrate directly or through another layer (an adhesive layer or a resist layer). Thus, the connection interface of bumps between the semiconductor element and the wiring substrate is stably pressed. In such a stably pressing state, the bumps are heated and melted. Thus, the resin for underfill does not adhere, reside, or interpose at the connection interface of the bumps. Consequently, a connection defect will not take place. Thus, the yield will improve.

When a cover member is placed on a semiconductor element, at the bump connecting step, the size of the space between the semiconductor element and the wiring substrate is kept constant. Thus, the height of the bumps is controlled. Consequently, it is not necessary to use a high controlling means for preventing the semiconductor element from lowering. Thus, the process can be simplified. In addition, the number of fabrication steps can be decreased. Moreover, the yield will improve and high throughput can be accomplished.

A second aspect of the present invention is a fabricating method of a semiconductor device, comprising the steps of (a) forming a non-fluid resin layer with a predetermined thickness on a connecting terminal formed surface of a wiring substrate, the wiring substrate having a connecting terminal and a wiring layer on at least one of main surfaces thereof, the non-fluid resin layer being not formed on the connecting terminal, (b) mounting a semiconductor element with a face down on a surface of which the non-fluid resin layer of the wiring substrate is formed, the semiconductor element having an electrode terminal on a main surface thereof, and contacting the electrode terminal of the semiconductor element and the connecting terminal of the wiring substrate through bumps formed on at least one of the electrode terminal and the connecting terminal, and (c) heating, melting the bumps to connect the electrode terminal of the semiconductor element and the connecting terminal of the wiring substrate therewith, and contacting the semiconductor element to the non-fluid resin layer.

As the bumps, bumps composed of low-melting metals such as solders can be used. In particular, it is preferable to use Pb—Sn solder bumps, Sn—Ag solder bumps, or Sn—Ag—Cu solder bumps.

In the fabricating method of a semiconductor device according to the second aspect, at the bump connecting step, while bumps are being heated, melted, and connected, the non-fluid resin layer formed on the wiring substrate can be hardened (for instance, cross-linked). When the bumps are connected and the non-fluid resin layer is hardened at the same step, the number of steps can be reduced.

As an example of the non-fluid resin, thermosetting resin or thermoplastic resin that contain 70 to 90% by weight of a filler such as silica can be used. The non-fluid resin layer can be formed as follows. The resin is formed in a sheet shape or a film shape. A resin sheet or film that has a through-hole corresponding to the connecting terminal of the wiring substrate is aligned with the wiring substrate and then adhered by adhesive agent.

When the content of the filler increases, the thermal expansion coefficient lowers. Thus, when a non-fluid resin layer of which the content of filler is large is formed between a semiconductor element and a wiring substrate, the stress due to the difference of the thermal expansion coefficients therebetween is effectively alleviated. Consequently, a semiconductor device with high connection reliability can be obtained.

In the case that a thermoplastic resin sheet containing high density of a filler is used, when bumps are thermally bonded, the thermoplastic resin layer swells out along the side peripheral surface of the semiconductor element. Thus, an underfill is formed in a good shape. In addition, the shape of the bumps can be controlled.

The non-fluid resin layer may be formed in the following method. In this method, photo-setting fluid resin is coated on a wiring substrate. The coated layer is exposed and developed with a mask having a predetermined pattern. Thus, a hardened resin layer having a pattern except for the connecting terminal can be formed.

According to the second aspect of the present invention, at the step of which bumps are heated, melted, and connected, with a support layer of a non-fluid resin layer formed on the connecting terminal formed surface of the wiring substrate, the height of the bumps (namely, the size of the space between the semiconductor element and the wiring substrate) is controlled. Thus, without a height controlling means for preventing the semiconductor element from lowering, the height of the bumps can be kept.

In addition, since a layer formed on a connecting terminal formed surface of a wiring substrate is a non-fluid resin layer, the resin does not adhere, reside, or interpose at the connection interface of the bumps. Thus, a connection defect does not take place. The thermal stress due to the difference of the thermal expansion coefficients between the semiconductor element and the wiring substrate is effectively alleviated with the bumps. Thus, a semiconductor device with high connection reliability can be accomplished.

In addition, when the thickness of the non-fluid resin layer is adjusted, the height of the bumps can be controlled. Thus, high and thin bumps (the height of the bumps is larger than the diameter thereof) can be accomplished. Consequently, the pitch of bumps can be narrowed corresponding to the pitch of the connecting pad.

These and other objects, features and advantages of the present invention will become more apparent in light of the following detailed description of a best mode embodiment thereof, as illustrated in the accompanying drawings.

DESCRIPTION OF PREFERRED EMBODIMENTS

Next, with reference to the accompanying drawings, embodiments of the present invention will be described.

Figure 1:
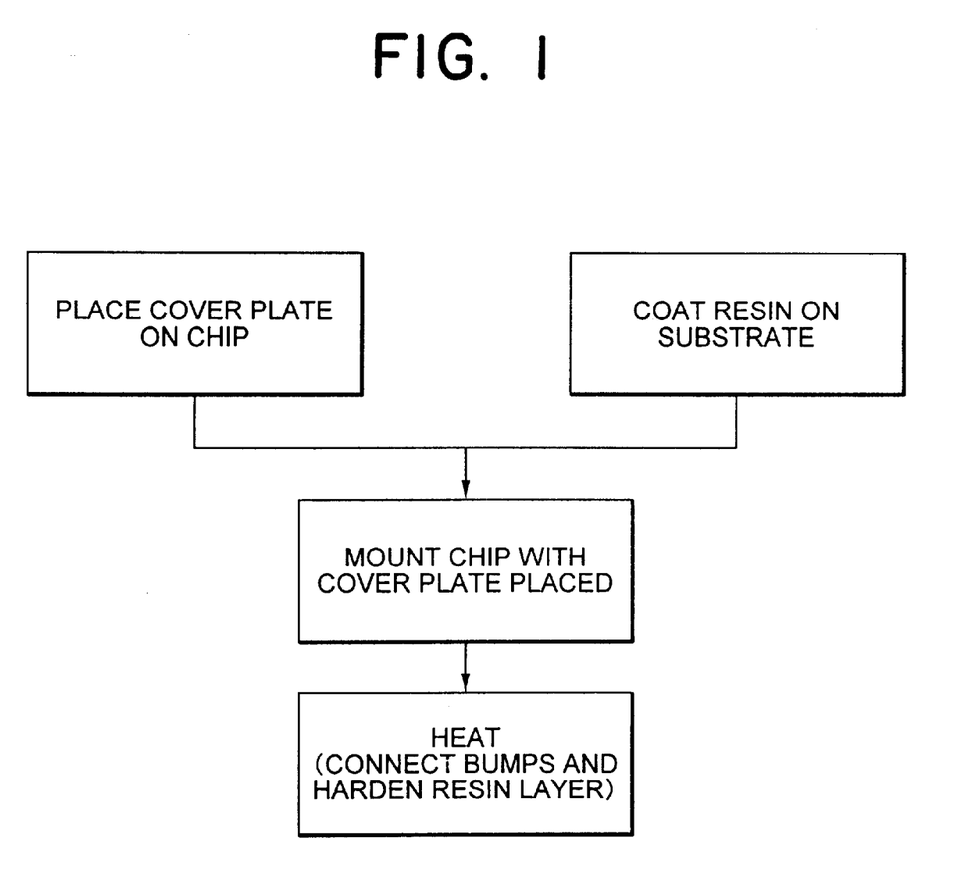
FIG. 1 is a flow chart showing a fabricating method of a semiconductor device according to a first embodiment of the present invention.
Figure 2A:
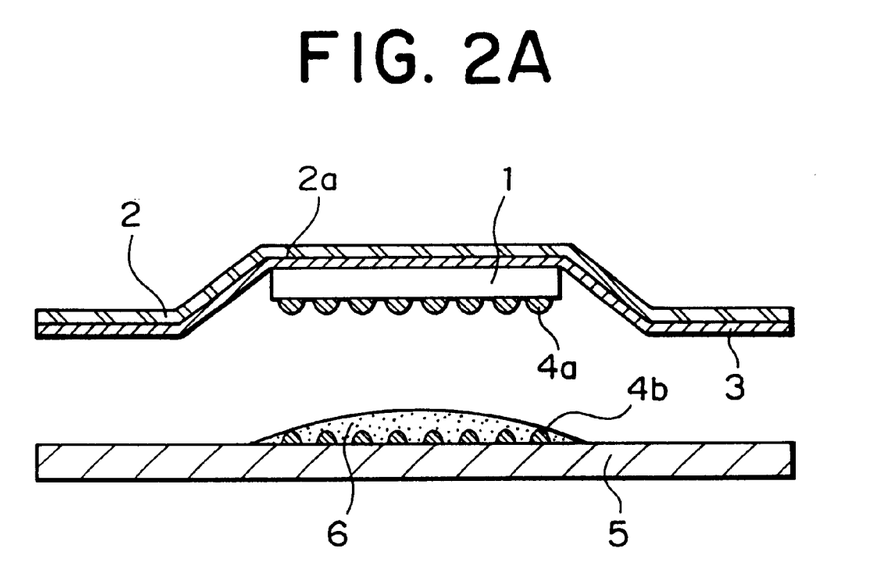
FIG. 2A, FIG. 2B, and FIG. 2C are cross sections showing individual steps of the fabricating method of the semiconductor device according to the first embodiment.
Figure 2B:
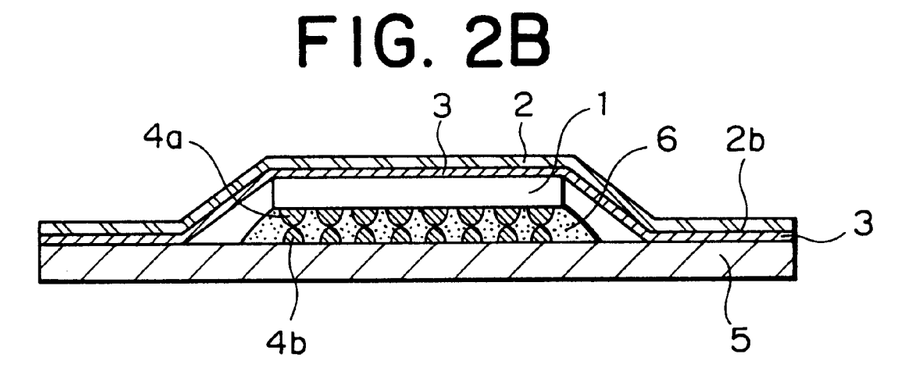
Figure 2C:
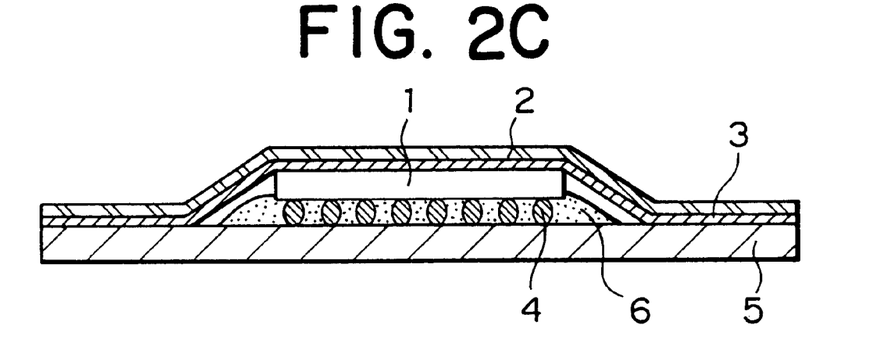

FIG. 1 is a flow chart showing a fabricating method of a semiconductor device according to a first embodiment of the present invention. FIGS. 2A to 2C are cross sections showing individual steps of the fabricating method according to the first embodiment.

According to the first embodiment, as shown in FIG. 2A, a cap shaped cover plate 2 is adhered to the opposite surface (rear surface) of an electrode pad formed surface of a semiconductor chip 1. The cover plate 2 has a concaved portion 2a at the center of the inner surface. The concaved portion 2a of the cover plate 2 has a depth that is equal to or smaller than the sum of the height of bumps (that will be described later) and the thickness of a semiconductor chip. The concaved portion 2a of the cover plate 2 is adhered to the rear surface of the semiconductor chip 1 through an adhesive agent layer 3. In addition, Pb—Sn solder bumps 4a are formed on the electrode pad of the semiconductor chip 1 by use of a printing method or the like.

On the other hand, solder bumps 4b are formed on a connecting pad of a glass-epoxy resin impregnated wiring substrate 5 by use of a printing method or the like. Thereafter, fluid resin that functions as underfill or flux is coated on the bump formed surface. Thus, a fluid resin layer 6 is formed.

Thereafter, as shown in FIG. 2B, the semiconductor chip 1 with the cover plate 2 adhered on the rear surface thereof is mounted with a face down on the fluid resin layer 6 formed surface of the wiring substrate 5. The solder bumps 4a formed on the electrode pad of the semiconductor chip 1 are contacted to the solder bumps 4b formed on the connecting pad of the wiring substrate 5. At that time, a peripheral portion 2b of the inner surface of the cover plate 2 is contacted to the wiring substrate 5. They are adhered with the adhesive agent layer 3.

Thereafter, as shown in FIG. 2C, the bumps 4a on the chip side and the solder bumps 4b on the substrate side are heated, melted, and connected. In addition, the fluid resin layer 6 formed on the wiring substrate 5 is cross-linked and hardened. At that time, since the solder bumps 4a and 4b are melted and connected, their height slightly lowers. However, since the peripheral portion 2b of the cover plate 2 is adhered to the wiring substrate 5, the size of the space between the semiconductor chip 1 and the wiring substrate 5 (namely, the height of the bumps 4 that have been connected) is controlled to a predetermined value.

In such a manner, the height of the bumps 4 that have been connected is kept. Thus, the thermal stress due to the difference of the thermal expansion coefficients between the semiconductor chip 1 and the wiring substrate 5 can be effectively alleviated. Consequently, a semiconductor device with high connection reliability can be accomplished. Since the pressing state of the solder bumps 4a on the chip side and the solder bumps 4b on the substrate side is stably maintained, the fluid resin does not adhere, reside, or interpose at the connection interface of the solder bumps 4a and 4b. Thus, since a connection defect does not take place, the yield will improve.

In addition, since the size of the space between the semiconductor chip 1 and the wiring substrate 5 (namely, the height of the bumps 4) is kept constant, it is not necessary to control the height of the bumps 4a and 4b so as to prevent the semiconductor chip 1 from lowering in the step for melting and connecting the bumps 4a and 4b. Thus, the yield can be improved with simplified steps. Consequently, high throughput can be accomplished.

Figure 3:
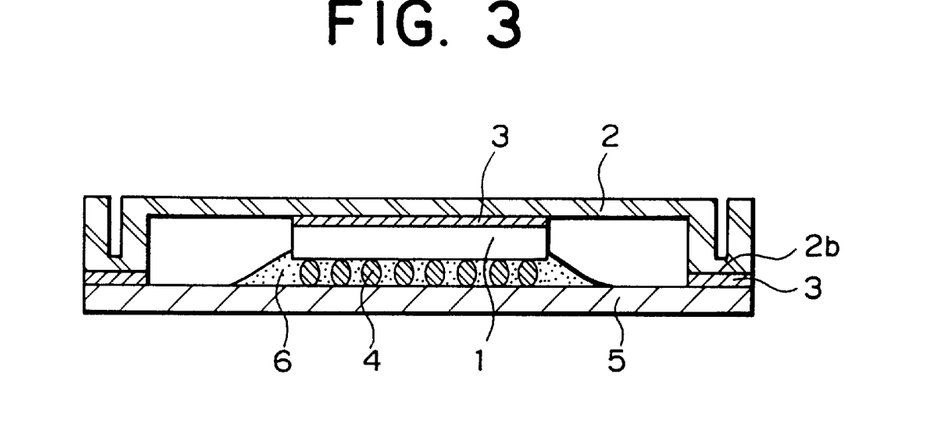
FIG. 3 is a cross section showing the structure of a semiconductor device fabricated with a box type cover plate according to the first embodiment.

According to the first embodiment, as shown in FIG. 3, as an example of the cover plate 2, a box shaped cover member that has a large concaved portion 2a at the center position and of which a peripheral frame shaped area 2b is contacted with the wiring substrate 5 may be used. FIG. 3 shows a semiconductor device fabricated with the cover plate 2 in the same manner as the first embodiment. In FIG. 3, similar portions to those in the first embodiment are denoted by similar reference numeral.

Next, second and third embodiments of the present invention will be described.

Figure 4:
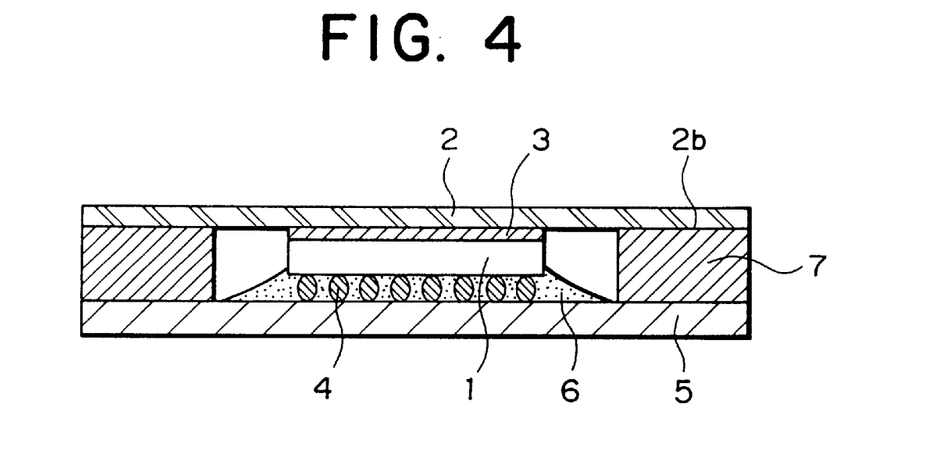
FIG. 4 is a cross section showing the structure of a semiconductor device according to a second embodiment of the present invention.
Figure 5:
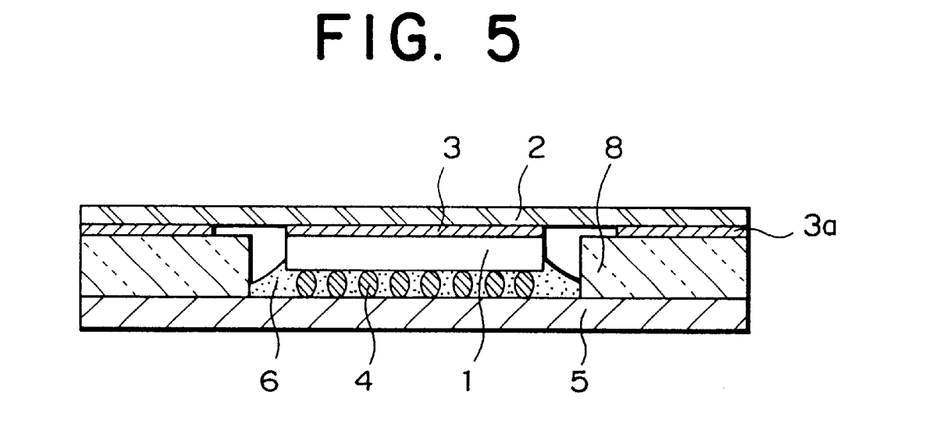
FIG. 5 is a cross section showing the structure of a semiconductor device according to a third embodiment of the present invention.

According to the second and third embodiments of the present invention, a cover plate 2 that does not have a concaved portion is used. According to the second embodiment, as shown in FIG. 4, a peripheral adhesive agent layer 7 is formed at a peripheral portion 2b of an inner surface of a cover plate 2 so that the thickness of the peripheral adhesive agent layer 7 is equal to or smaller than the sum of the height of connected bumps 4 and the thickness of a semiconductor chip 1. According to the third embodiment, as shown in FIG. 5, a solder resist layer 8 is formed at a peripheral portion of a semiconductor chip 1 mounted area of a wiring substrate 5 so that the thickness of the solder resist layer 8 is equal to or smaller than the sum of the height of the bumps 4 being connected and the thickness of the semiconductor chip 1.

According to the second and third embodiments, the semiconductor chip 1 with the cover plate 2 adhered is mounted with a face down on the fluid resin layer 6 formed surface of the wiring substrate 5. Thereafter, the solder bumps formed on the semiconductor chip 1 side and the solder bumps formed on the wiring substrate 5 side are contacted.

At that time, according to the second embodiment, the peripheral portion 2b of the cover plate 2 is contacted to the wiring substrate 5 through the peripheral adhesive agent layer 7 having a predetermined thickness formed on the cover plate 2 side. Thus, they are adhered with the adhesive agent layer 7. According to the third embodiment, the peripheral portion 2b of the cover plate 2 is contacted to the solder resist layer 8 formed on the wiring substrate 5. They are adhered with the adhesive agent layer 3a formed on the cover plate 2 side. In each of the second and third embodiments, since the semiconductor chip 1 is kept with a predetermined height, the size of the space between the semiconductor chip 1 and the wiring substrate 5 (namely, the height of the bumps) is controlled with a predetermined value.

In such a state, the solder bumps on the chip side and the solder bumps on the substrate side are heated, melted, and connected. In addition, the fluid resin layer 6 formed on the wiring substrate 5 is hardened.

In the second and third embodiments, as with the first embodiment, at the step of which the bumps 4a and 4b are heated, melted, and connected, the bumps 4 are kept high. Thus, the stress due to the difference of the thermal expansion coefficients between the semiconductor chip 1 and the wiring substrate 5 is alleviated. Consequently, a semiconductor device with a high connection reliability can be accomplished. In addition, since the pressed state of the bumps on the chip side and the bumps on the substrate side are stably maintained, the fluid resin does not adhere, reside, or interpose at the connection interface of the bumps. Thus, since a connection detect does not take place, the yield will improve.

In addition, according to the third embodiment of which the solder resist layer 8 with a predetermined thickness is formed on the substrate side, since the solder resist layer 8 functions as a dam for the fluid resin layer 6 formed on the wiring substrate 5, the fluid resin layer 6 does not excessively spread out. Thus, an underfill having a fillet-shaped portion is formed.

Next, a fourth embodiment of the present invention will be described.

Figure 6A:
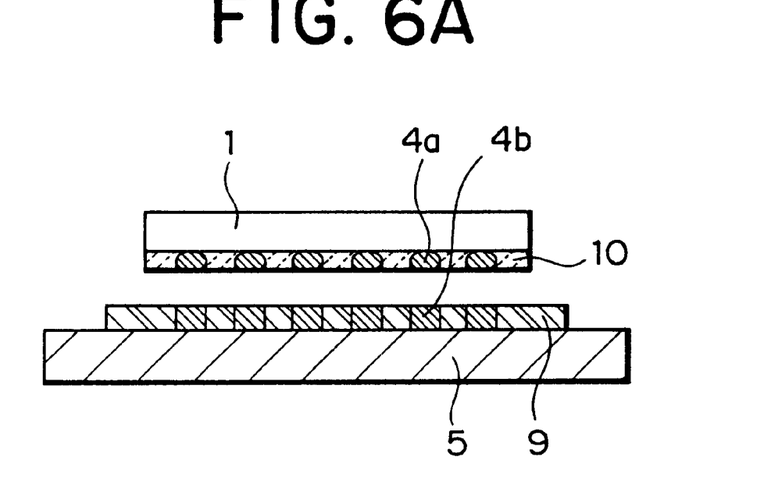
FIG. 6A, FIG. 6B and FIG. 6C are cross sections showing individual steps of a fabricating method of a semiconductor device according to the fourth embodiment of the present invention.

According to the fourth embodiment, as shown in FIG. 6A, a non-fluid resin layer 9 with a predetermined thickness is formed on a connecting pad formed surface of a wiring substrate 5 in such a manner that the non-fluid resin layer 9 is not formed on the connecting pad. In other words, after photosensitive (for example, ultraviolet-setting type) liquid resin is coated on the connecting pad formed surface of the wiring substrate 5, a mask having a pattern corresponding to the connecting pad is placed on the fluid resin coated layer. Thereafter, ultraviolet ray is radiated (exposed) on the mask and developed. Thus, a hardened resin layer having a predetermined pattern except for the connecting pad is formed. The hardened resin layer is a non-fluid resin layer 9.

Pb—Sn, Sn—Ag, or Sn—Ag—Cu based solder bumps 4a and 4b are formed on the connecting pad of the wiring substrate 2 and the electrode pad of the semiconductor chip 1 corresponding to a printing method or the like. In FIG. 6A, reference numeral 10 denotes a protecting layer such as a solder resist layer formed on the electrode pad formed surface of the semiconductor chip 1.

Figure 6B:
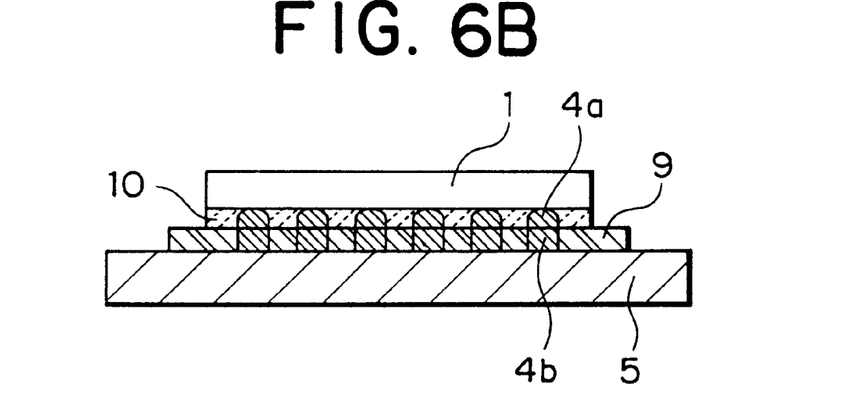

Thereafter, as shown in FIG. 6B, the semiconductor chip 1 is mounted with a face down on the surface of which the non-fluid resin layer 9 of the wiring substrate 5 is formed. Next, the solder bumps 4a formed on the electrode pad of the semiconductor chip 1 and the solder bumps 4b formed on the connecting pad of the wiring substrate 5 are contacted.

Figure 6C:
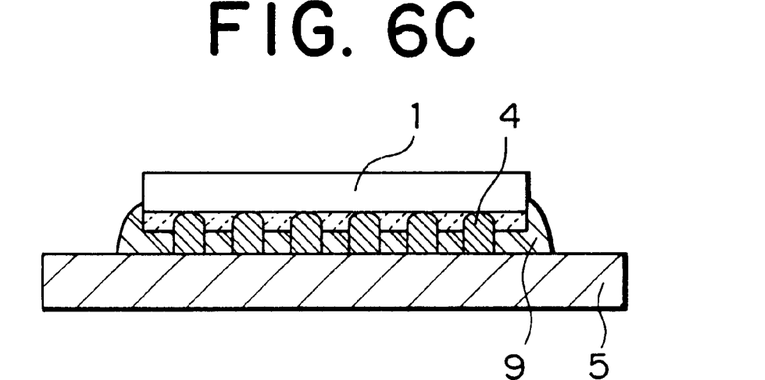

While the solder bumps 4a, 4b are being pressed, they are heated. Thus, as shown in FIG. 6C, the solder bumps 4a on the semiconductor chip side and the solder bumps 4b on the wiring substrate side are melted and connected. In addition, the semiconductor chip 1 is pressed and contacted to the nonfluid resin layer 9. While the bumps 4a and 4b are being melted and connected, the non-fluid resin layer 9 can be hardened (cross-linked).

According to the fourth embodiment, at the step of which the bumps 4a and 4b are heated, melted, and connected, the non-fluid resin layer 9 formed on the wiring substrate 5 upwardly supports the electrode pad formed surface of the semiconductor chip 1. Thus, since the size of the space between the semiconductor chip 1 and the wiring substrate 5 is controlled, the semiconductor chip 1 does not almost lower after the bumps 4a and 4b are melted and connected. Consequently, the connected bumps 4 are kept high. As a result, the thermal stress due to the difference of the thermal expansion coefficients between the semiconductor chip 1 and the wiring substrate 5 can be effectively alleviated. Thus, a semiconductor device with high connection reliability can be accomplished.

When the height of the bumps 4 is controlled, long and thin bumps whose height is larger than the diameter thereof can be accomplished. Thus, the pitch of bumps becomes narrow corresponding to the pitch of the connecting pad. In addition, while the bumps 4a and 4b are being melted and connected, the non-fluid resin layer 9 formed on the wiring substrate 5 can be hardened at the same step. Thus, since the number of fabrication steps is decreased, the efficiency of the fabrication can be improved.

According to the fourth embodiment, photosensitive fluid resin is coated on the connecting pad formed surface of the wiring substrate 5. Thereafter, the coated resin is exposed and developed. Thus, the non-fluid resin layer 9 is formed. As the non-fluid resin, thermosetting resin in which 70 to 90% by weight of a filler such as silica is contained may be used. Such a resin material is formed in a sheet shape or film shape. A through-hole is formed on the resin sheet or film corresponding to the connecting pad of the wiring substrate 5. Thereafter, the resin sheet or film can be adhered to the wiring substrate 5 by adhesive agent or the like.

When thermosetting resin containing a large amount of a filler is used as non-fluid resin and the resin is formed in the space between the semiconductor chip 1 and the wiring substrate 5, the thermal stress is more effectively alleviated. Thus, a semiconductor device with very high connection reliability can be accomplished.

Figure 7:
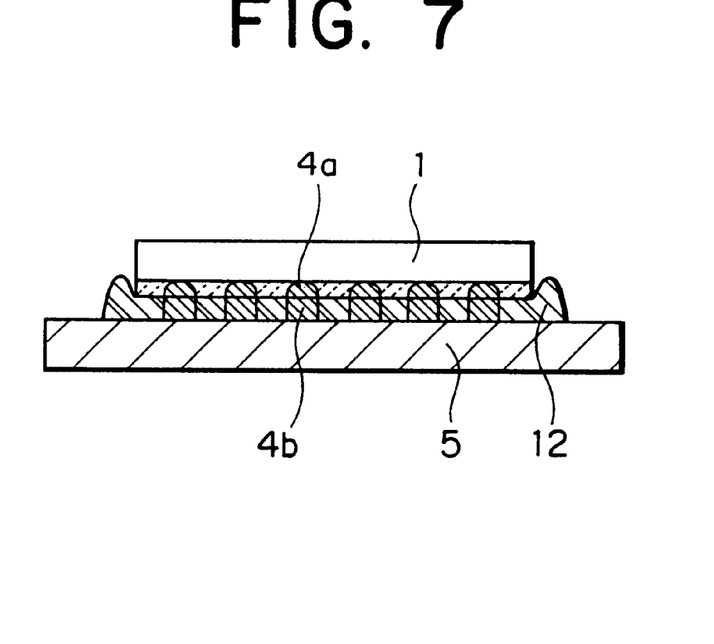
FIG. 7 is a cross section showing the structure of a semiconductor device fabricated with a thermoplastic resin sheet as a non-fluid resin layer according to the fourth embodiment.

As an example of the non-fluid resin layer, a sheet of the thermoplastic resin containing a large amount of such a filler can be also used. When such a thermoplastic resin sheet or film is adhered to the wiring substrate 5, as shown in FIG. 7, at the step of which the solder bumps 4a and 4b are heated, melted, and connected, by pressing the semiconductor chip 1, the thermoplastic resin sheet 1 deforms and swells out along the side peripheral surface of the semiconductor chip 1. Thus, an underfill is formed in a good shape with good characteristics.

In the above-described embodiments, solder bumps 4a and 4b are formed on the electrode pad of the semiconductor chip 1 and the connecting pad of the wiring substrate 5. However, even if solder bumps are formed on either the electrode pad of the semiconductor chip 1 or the connecting pad of the wiring substrate 5, the same effect can be obtained.

As was described above, according to the fabricating method according to the present invention, since underfill resin does not adhere, reside, or interpose at the connection interface of bumps, a connection defect does not take place. Thus, a semiconductor device with high reliability and high yield can be accomplished. In addition, the height of bumps can be controlled. Thus, a semiconductor device having a bump connected portion with high reliability can be fabricated with simplified steps.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A fabricating method of a semiconductor device, comprising the steps of:
   (a) forming a resin layer on a connecting terminal formed surface of a wiring substrate, the wiring substrate having a connecting terminal and a wiring layer on at least one main surface thereof;
   (b) adhering an inner surface of a cover member on the opposite surface of an electrode terminal formed surface of a semiconductor element, the semiconductor element having an electrode terminal on a main surface thereof;
   (c) mounting the semiconductor element with the cover member placed with a face down on a surface of which the resin layer of the wiring substrate is formed, contacting a peripheral portion of the inner surface of the cover member, and contacting the electrode terminal of the semiconductor element and the connecting terminal of the wiring substrate through bumps formed on at least one of the electrode terminal and the connecting terminal; and
   (d) heating and melting the bumps to connect the electrode terminal of the semiconductor element and the connecting terminal of the wiring substrate therewith.

2. The fabricating method as set forth in claim 1, wherein the bumps are Pb—Sn solder bumps.

3. The fabricating method as set forth in claim 1, wherein the bumps are Sn—Ag or Sn—Ag—Cu solder bumps.

4. The fabricating method as set forth in claim 1, wherein while step (d) is being performed, the resin layer formed on the wiring substrate is hardened.

5. The fabricating method as set forth in claim 1, wherein the cover member has a concaved portion whose depth is equal to or smaller than the sum of the height of the bump and the thickness of the semiconductor element, and wherein at step (b), the inner surface of the concaved portion is adhered to the semiconductor element.

6. The fabricating method as set forth in claim 1, further comprising the step of:
   forming an adhesive layer whose thickness is equal to or smaller than the sum of the height of the bump and the thickness of the semiconductor element in a peripheral portion of the inner surface of the cover member, and
   wherein at step (c), the adhesive layer of the cover member is contacted to the wiring substrate.

7. The fabricating method as set forth in claim 1, further comprising the step of:
   forming a resist layer whose thickness is equal to or smaller than the sum of the height of the bump and the thickness of the semiconductor element in a peripheral area of a semiconductor element mounted portion of the wiring substrate,
   wherein at step (c), the peripheral portion of the cover member is contacted to the resist layer.

8. A fabricating method of a semiconductor device, comprising the steps of:
   (a) forming a non-fluid resin layer with a predetermined thickness on a surface of a wiring substrate, the surface of the wiring substrate having a connecting terminal and a wiring layer, the non-fluid resin layer not being formed on the connecting terminal;
   (b) forming a first bump on the connecting terminal of the wiring substrate;
   (c) preparing a semiconductor element having an electrode terminal on a main surface thereof;

(d) forming a second bump on the electrode terminal of the semiconductor element;

(e) mounting the semiconductor element with a face down on a surface of the wiring substrate, the surface of the wiring substrate having the non-fluid resin layer, and contacting the second bump of the semiconductor element with the first bump of the wiring substrate; and (f) heating and melting the first bump and the second bump to connect the electrode terminal of the semiconductor element and the connecting terminal of the wiring substrate, and contacting the semiconductor element to the non-fluid resin layer.

9. The fabricating method as set forth in claim 8, wherein the first bump and the second bump are Pb—Sn solder bumps.

10. The fabricating method as set forth in claim 8, wherein the first bump and the second bump are Sn—Ag or Sn—Ag—Cu solder bumps.

11. The fabricating method as set forth in claim 8, wherein the non-fluid resin layer formed on the wiring substrate is hardened while the step (f) is being performed.

12. The fabricating method as set forth in claim 8, wherein the non-fluid resin layer is a thermosetting resin layer containing 70 to 90 % by weight of a filler or a thermoplastic resin layer containing 70 to 90 % by weight of a filler.

13. The fabricating method as set forth in claim 8, wherein step (a) has the steps of:

forming a sheet or a film composed of the non-fluid resin;

forming a through-hole in the sheet or film corresponding to the connecting terminal of the wiring substrate; and adhering the sheet or film with the through-hole to the wiring substrate.

14. A fabricating method of a semiconductor device, comprising the steps of:

(a) forming a non-fluid resin layer with a predetermined thickness on a surface of a wiring substrate, the surface of the wiring substrate having a connecting terminal and a wiring layer, the non-fluid resin layer not being formed on the connecting terminal;

(b) preparing a semiconductor element having an electrode terminal on a main surface thereof;

(c) forming bumps on at least one of the electrode terminal of the semiconductor element and the connecting terminal of the wiring substrate;

(d) mounting the semiconductor element face down on a surface of the wiring substrate, the surface of the wiring substrate having the non-fluid resin layer;

(e) contacting the electrode terminal and the connecting terminal through the bumps; and (f) heating and melting the bumps to connect the electrode terminal of the semiconductor element and the connecting terminal of the wiring substrate, and contacting the semiconductor element to the non-fluid resin layer;

wherein step (a) has the steps of:

coating photo-setting liquid resin on the wiring substrate; and exposing and developing the liquid resin layer with a mask having a predetermined pattern, and forming a photo-setting layer.

15. The fabricating method as set forth in claim 14, wherein the step (c) has the steps of forming a first bump on the connecting terminal of the wiring substrate and forming a second bump on the electrode terminal of the semiconductor element.

* * * * *